United States Patent
Wei et al.

(10) Patent No.: US 6,962,839 B2
(45) Date of Patent: Nov. 8, 2005

(54) APPARATUS AND MANUFACTURING PROCESS OF CARBON NANOTUBE GATE FIELD EFFECT TRANSISTOR

(75) Inventors: Jeng-Hua Wei, Taipei (TW); Hsin-Hui Chen, Kaohsiung (TW); Ming-Jiunn Lai, Taichung (TW); Hung-Hsiang Wang, Taipei (TW); Ming-Jer Kao, Tianan (TW)

(73) Assignee: Industrial Technology Research Institute, Chutung Hsinchu (TW)

( * ) Notice: Subject to any disclaimer, the term of this patent is extended or adjusted under 35 U.S.C. 154(b) by 0 days.

(21) Appl. No.: 10/901,091

(22) Filed: Jul. 29, 2004

(65) Prior Publication Data

US 2005/0012163 A1 Jan. 20, 2005

Related U.S. Application Data

(62) Division of application No. 10/452,235, filed on Jun. 3, 2003, now Pat. No. 6,852,582.

(30) Foreign Application Priority Data

May 5, 2003 (TW) .................................. 92112252 A

(51) Int. Cl.$^7$ .................. H01L 21/337; H01L 21/3205; H01L 21/4763

(52) U.S. Cl. ................ 438/195; 438/196; 438/587
(58) Field of Search ................ 438/195, 196, 438/197, 192, 199, 587, 591

(56) References Cited

U.S. PATENT DOCUMENTS

| | | | | |
|---|---|---|---|---|
| 5,965,911 | A | * 10/1999 | Joo et al. | 438/197 |
| 6,545,396 | B1 | * 4/2003 | Ohki et al. | 313/309 |
| 6,705,910 | B2 | * 3/2004 | Sheu et al. | 445/24 |
| 6,740,910 | B2 | * 5/2004 | Roesner et al. | 438/192 |
| 6,780,663 | B2 | * 8/2004 | Park et al. | 438/52 |
| 6,835,613 | B2 | * 12/2004 | Schlaf | 438/199 |
| 6,852,582 | B2 | * 2/2005 | Wei et al. | 438/195 |

* cited by examiner

*Primary Examiner*—Michael Lebentritt
*Assistant Examiner*—Walter L. Lindsay, Jr.
(74) *Attorney, Agent, or Firm*—Bacon & Thomas, PLLC

(57) ABSTRACT

The present invention generally relates to an apparatus and method of carbon nanotube (CNT) gate field effect transistor (FET), which is used to replace the current metal gate of transistor for decreasing the gate width greatly. The carbon nanotube has its own intrinsic characters of metal and semiconductor, so it can be the channel, connector or next-level gate of transistor. Furthermore, the transistor has the structure of exchangeable source and drain, and can be defined the specificity by outside wiring.

4 Claims, 6 Drawing Sheets

APPARATUS AND MANUFACTURING PROCESS OF CARBON NANOTUBE GATE FIELD EFFECT TRANSISTOR

This application is a divisional application of U.S. application Ser. No. 10/452,235, filed Jun. 3, 2003 now U.S. Pat. No. 6,852,582 (of which the entire disclosure of the prior application is hereby incorporated by reference).

BACKGROUND OF THE INVENTION

1. Field of the Invention

The invention relates to an apparatus and manufacturing process of carbon nanotube gate FET, for the carbon nanotube can be the channel, connector or next-level gate of transistor, and the source and drain of transistor can be exchanged and defined the specificity by outside wiring.

2. Description of the Prior Art

As entering the age of nano scale, the device is getting smaller, so fabricating the nano-scale devices using nano-scale matter becomes the trend of progress, eg. the CNT-FET bases on CNT material. But the gate width of transistor is still limited by conventional process of sputtering, metal-screen-printing and etching.

Please refer to FIG. 1, which is a schematic diagram showing the structure of carbon nanotube transistor in the prior art. First of all, depositing an oxide layer 12 above a silicon substrate 11, and the oxide layer 12 could be SiO2. Then depositing a metal thin film to be source 13a and drain 13b respectively, and patterning using the method of photolithographic etching, and coating the carbon nanotube 14 between the source 13a and drain 13b. Immersing the device into a gas where carbon is applied for the process of coating CNT on the oxide layer 12, and the conducting channel among the electrodes. Finally, depositing a gate-insulated layer 15 above source 13a, drain 13b and carbon nanotube 14, then sputtering a metal layer 16, which is the gate of device.

In the prior art of IBM who announced a 260 nm CNT-FET, but the gate of device is still the metal material mainly, eg. Al, Ti. So the size of device in this prior art is limited by the process of semiconductor.

Therefore, for decreasing the gate width, there needs to provide the CNT to replace the conventional metal gate. And the CNT can be the channel, connector or next-level gate of transistor with the specificity of metal and semiconductor.

SUMMARY OF THE INVENTION

It is a primary object of the present invention to provide an apparatus and manufacturing process of CNT gate FET, which is used to replace the current metal gate of a transistor for decreasing the gate width greatly. The CNT has its own intrinsic characters of metal and semiconductor, so it can be the channel, connector or next-level gate of transistor. Furthermore, the transistor has the structure of exchangeable source and drain, and can be defined the specificity by outside wiring.

BRIEF DESCRIPTION OF THE DRAWINGS

The objects, spirits and advantages of the preferred embodiments of the present invention will be readily understood by the accompanying drawings and detailed descriptions, wherein.

DETAILED DESCRIPTION OF THE INVENTION

The present invention relates to an apparatus and method of forming carbon nanotube (CNT) gate field effect transistor (FET), which is used to replace the current metal gate of transistor. That can decrease the gate width greatly into the nano-scale range, and work well in this kind of scale. Also, the carbon nanotube has its own intrinsic characters of metal and semiconductor, so the gate, source and drain of the transistor can be exchanged. Then, it can define the device's specificity by outside wiring, and present the same characters with regular transistor.

Figure 1:
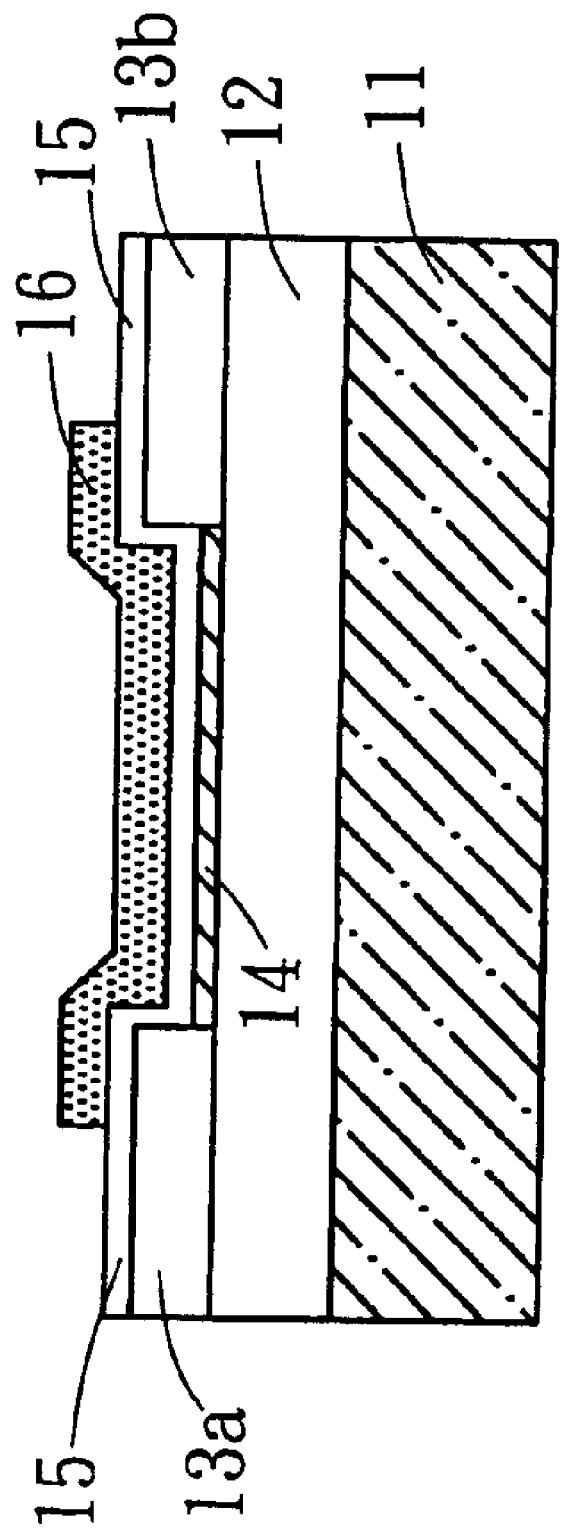
FIG. 1 is a schematic diagram showing the structure of carbon nanotube transistor in the prior art.
Figure 2:
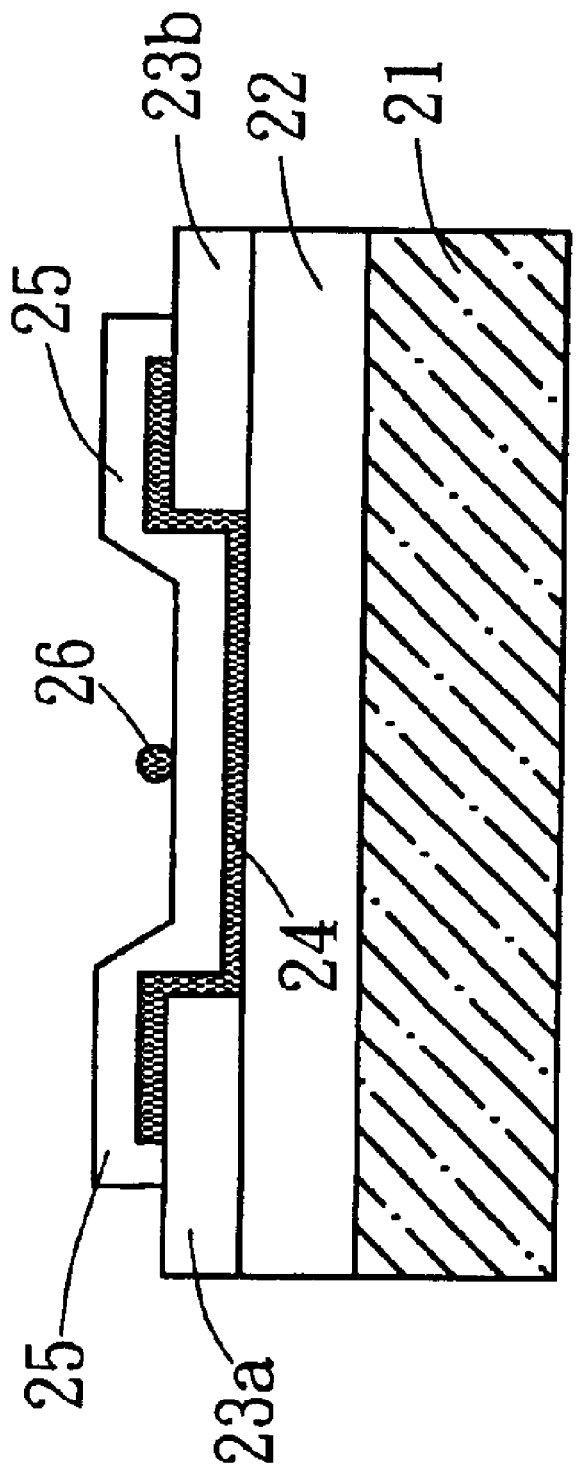
FIG. 2 is a schematic diagram showing the structure of carbon nanotube gate transistor in accordance with one preferred embodiment of the present invention.

Please refer to FIG. 2, which is a schematic diagram showing the structure of carbon nanotube gate transistor in accordance with one preferred embodiment of the present invention. To begin with, there is a silicon substrate 21 existed on the bottom layer, and there is another isolated layer 22 deposited above, the isolated layer 22 is usually implemented by oxide material. Then, to deposit source 23a and drain 23b of transistor on the isolated layer 22 separately. Wherein, the source 23, is an electrode placed above said isolated layer, the drain 23b is an electrode placed above said isolated layer. Next, to deposit a channel layer 24, which is made by carbon nanotube material, above the source 23a, drain 23b and the channel layer 24, and connect them to each other further. The channel layer 24 is the conducting channel between source 23a and drain 23b. There is another gate-insulated layer 25 used to isolate a gate 26, which is made by a carbon nanotube, from the source 23a and the drain 23b.

Figure 3:
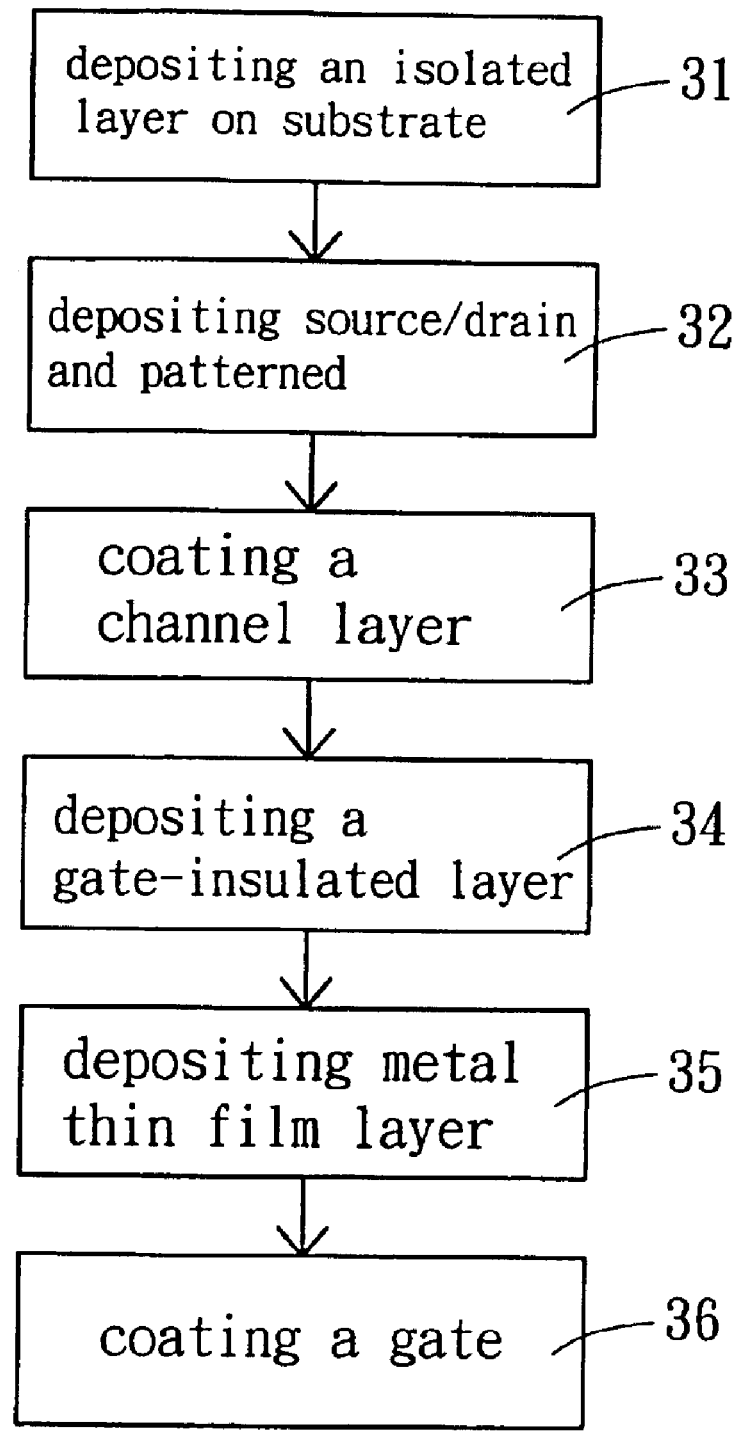
FIG. 3 is a flow chart showing the steps of process of CNT gate FET in accordance with one preferred embodiment of present invention.

In FIG. 3, which is a flow chart showing the steps of process of CNT gate FET of present invention, the steps comprise: depositing an isolated layer above a silicon substrate (step 31), the isolated layer is used to insulate other components of device; then, depositing a metal thin film on the isolated layer, which is patterned by the method of photolithography etching, for use in the source and drain of device electrodes (step 32); after that, coating a channel layer between the drain and the source (step 33), and the channel layer is made by carbon nanotube material, that is the first material adopted carbon nanotube in this invention, and used to be the conducting channel between the source and drain; depositing a gate-insulated layer above the channel layer, which is deposited between a gate and the channel layer and be insulated the gate from source, drain and the channel layer as recited above (step 34); depositing a metal thin film, which is patterned by the method of photolithography, is used to be the transistor's gate junction (step 35). The metal region is formed by the metal thin film, which is patterned and used to be the gate-junction for bio-sample testing. Receiving the end step, coating the gate, which is made by carbon nanotube material above the metal region and used be the gate electrode of device, this is the second material adopted carbon nanotube in this invention (step 36).

As recited above, the apparatus of carbon nanotube gate of field effect transistor of the invention is achieved, that will be multi-function CNT-FET whose specificity can be learned by any electronic measurement.

The carbon nanotube has its own intrinsic characters of metal and semiconductor, so the source and drain can be exchanged and be defined the specificity by outside wiring. If let the carbon nanotube gate 26, which showed in FIG. 2, connect each other with a plurality of CNT-FET, or connect the plurality of source and the drain with each other, that can be the logic gate, P-type or N-type transistor generally.

Figure 4:
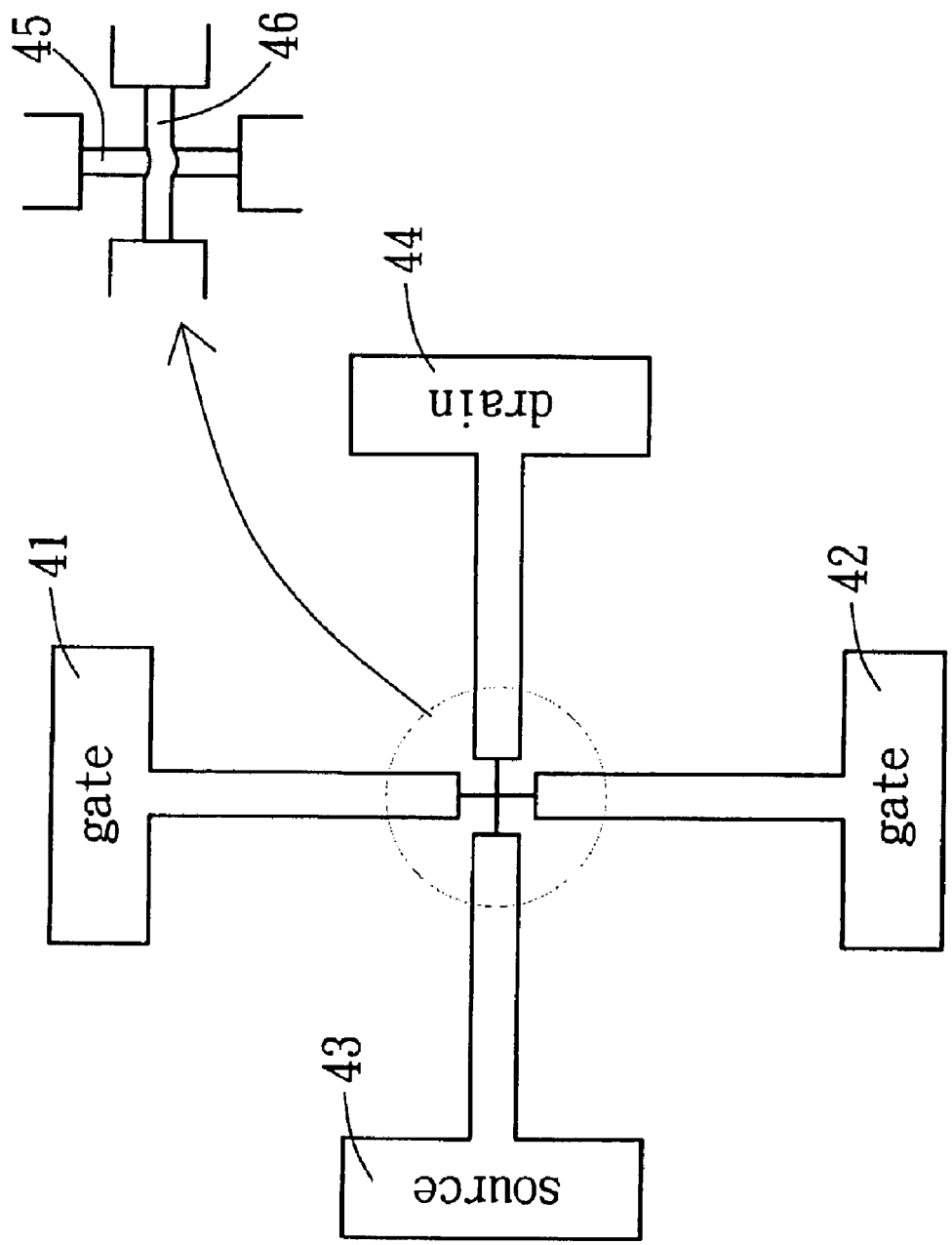
FIG. 4 is a schematic diagram showing the connecting of CNT gate FET in accordance with one preferred embodiment of present invention.

Please refer to FIG. 4, which is a schematic diagram showing the connecting of CNT gate FET of present invention. There are a plurality of CNT-FETs with CNT-gate connected serially with each other by the gates, furthermore, there are also a plurality of CNT-FETs with CNT-gate connected parallel with each other by the sources and drains of the devices. As showed in FIG. 4, the first gate 41 and the second gate 42 are connected with a plurality of CNT-FETs through the first CNT 45. The source 43 and drain 44 are connected through second CNT 46 to generate the conducing channel as the metal material. And inside the transistor device, the characters of device can be defined by the outside wiring, and not limited by design of prior ones.

Figure 5:
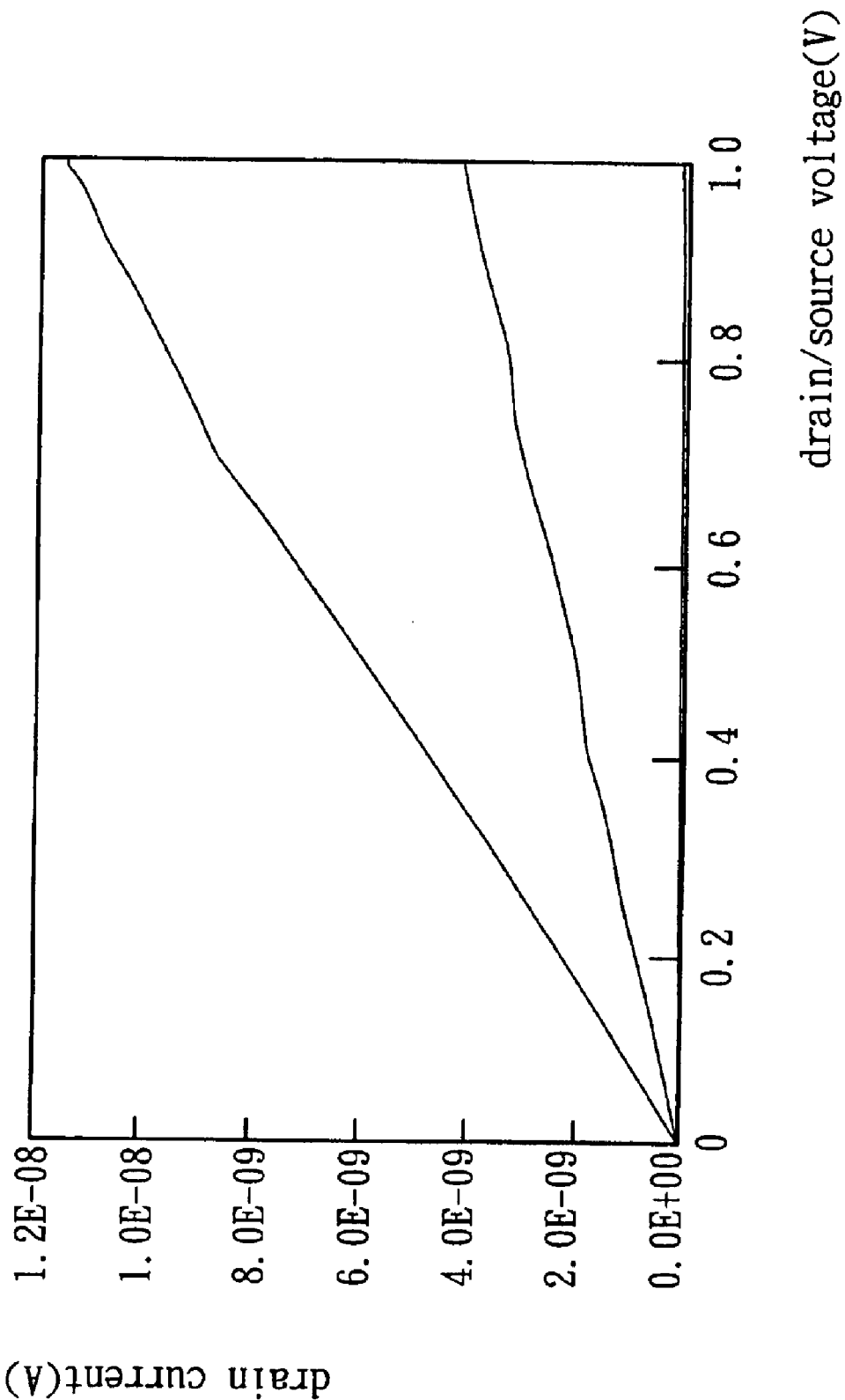
FIG. 5 is an I–V curve chart showing the CNT gate N-type FET in accordance with one preferred embodiment of present invention.

Refer to FIG. 5, this is a I–V curve chart showing the CNT gate N-type FET as recited above. The horizontal axis stands for the voltage of source and drain, and the vertical axis stands for the current generated from drain. In this curve chart, the voltage goes through the ends of source and drain is 0 to 1.0 volt, we can learn that is the character of N-type FET from the I/V curve in this curve chart. That means the CNT channel of CNT-FET can turn off smoothly in the condition of nano-scale gate width, and achieve the purpose of replacing the gate electrode by CNT-gate.

Figure 6:
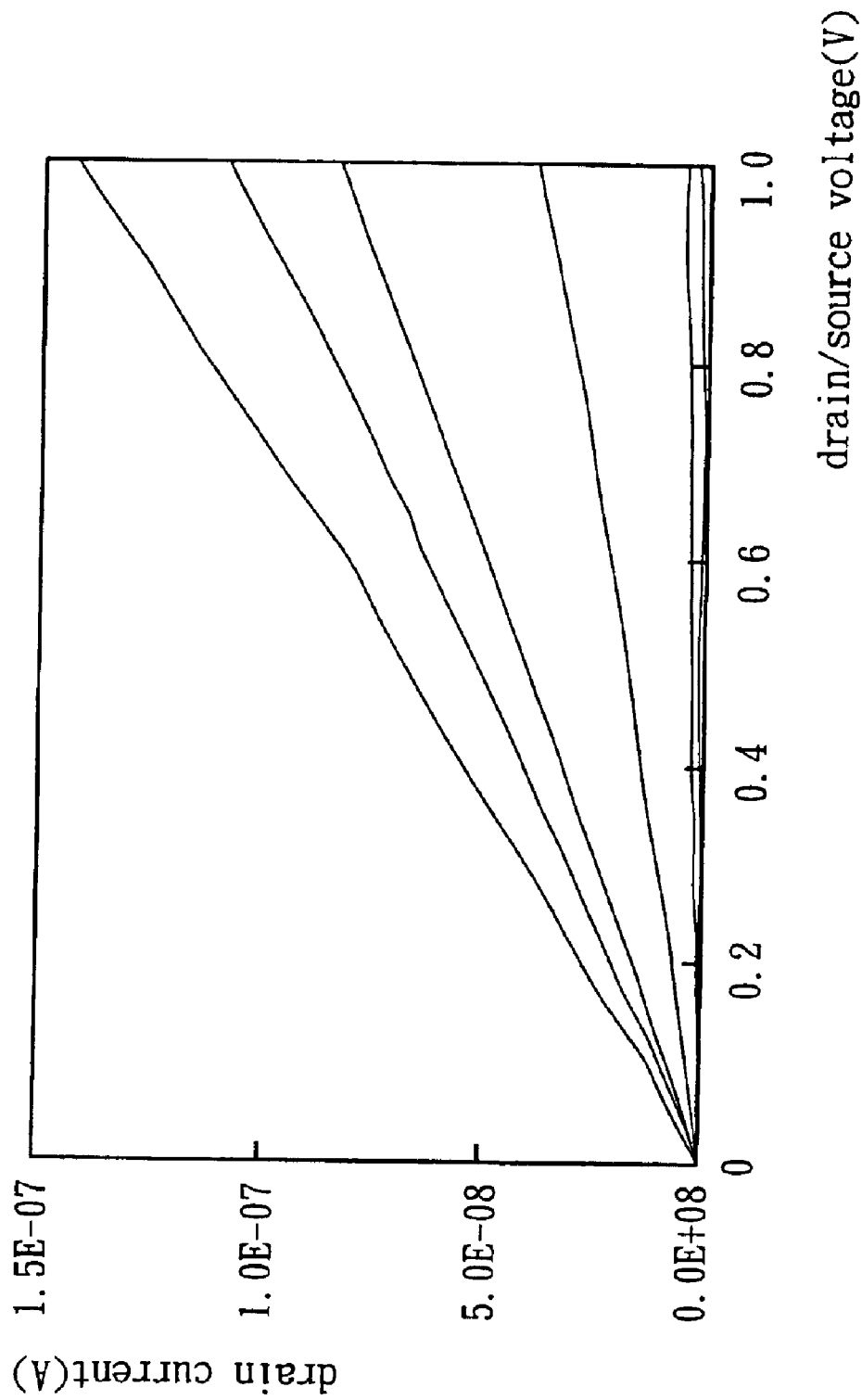
FIG. 6 is an I–V curve chart showing the CNT gate P-type FET in accordance with one preferred embodiment of present invention.

Otherwise, if that changes the connection of device electrodes showed in FIG. 4 reversely, i.e. to connect to the first gate 41 and second gate 42 with the voltage connected to source and drain originally, that conducting channel changes from original second CNT 46 to first CNT 45 showed in FIG. 4. On account of the CNT has its own characters of metal and semiconductor, the second CNT 46 will be the CNT of P-channel, i.e. the original N-type CNT-FET changes to P-type CNT-FET whose I/V curve showed on FIG. 6, which is an I–V curve chart showing the CNT gate P-type FET. The present invention shows the characters of multi-function transistor with the behavior of electronic hole/electron carriers in device truly.

According to the above discussion, the present invention discloses an apparatus and manufacturing process of carbon nanotube gate FET, which is used to replace the current metal gate of transistor for decreasing the gate width greatly. The CNT in device can be the channel region, connector and the next-level gate. Therefore, the present invention has been examined to be progressive, advantageous and applicable to the industry.

Although this invention has been disclosed and illustrated with reference to particular embodiments, the principles involved are susceptible for use in numerous other embodiments that will be apparent to persons skilled in the art. This invention is, therefore, to be limited only as indicated by the scope of the appended claims.

What is claimed is:

1. A manufacturing process of carbon nanotube gate field effect transistor, which is used to replace a current metal gate of transistor by the carbon nanotube material, said manufacturing process comprising steps of:

depositing an isolated layer above a silicon substrate;

depositing a metal thin film on said isolated layer, wherein said metal thin film is used to be a source and a drain;

coating a channel layer between said drain and said source;

depositing a gate-insulated layer above said channel layer;

depositing a metal region, which is used to be said transistor's gate junction; and coating a carbon nanotube gate above said metal region.

2. The manufacturing process of carbon nanotube gate field effect transistor as recited claim 1, wherein said channel layer is the conducting channel between said source and said drain.

3. The manufacturing process of carbon nanotube gate field effect transistor as recited claim 1, wherein said channel layer is made by carbon nanotube material.

4. The manufacturing process of carbon nanotube gate field effect transistor as recited claim 1, wherein said gate-insulated layer is deposited between said gate and said channel layer.

* * * * *